US012726167B2

(12) United States Patent
Loo et al.

(10) Patent No.: US 12,726,167 B2
(45) Date of Patent: Sep. 1, 2026

(54) METHOD FOR FABRICATING FILM BULK ACOUSTIC RESONATOR (FBAR), FBAR, AND FILTER

(71) Applicant: AAC Technologies Pte. Ltd., Tampines (SG)

(72) Inventors: LiEng Loo, Singapore (SG); Ke Wu, Shenzhen (CN); Kahkeen Lai, Singapore (SG)

(73) Assignee: AAC Technologies Pte. Ltd., Tampines (SG)

(*) Notice: Subject to any disclaimer, the term of this patent is extended or adjusted under 35 U.S.C. 154(b) by 491 days.

(21) Appl. No.: 18/313,319

(22) Filed: May 6, 2023

(65) Prior Publication Data

US 2024/0372519 A1 Nov. 7, 2024

(51) Int. Cl.

| | |
|---|---|
| ***H03H 3/04*** | (2006.01) |
| ***H03H 9/13*** | (2006.01) |
| ***H03H 9/17*** | (2006.01) |
| ***H03H 9/56*** | (2006.01) |

(52) U.S. Cl.

CPC ................ *H03H 3/04* (2013.01); *H03H 9/13* (2013.01); *H03H 9/171* (2013.01); *H03H 9/176* (2013.01); *H03H 9/562* (2013.01); *H03H 9/564* (2013.01); *H03H 9/568* (2013.01); *H03H 2003/0428* (2013.01)

(58) Field of Classification Search

CPC ............ H03H 3/04; H03H 9/13; H03H 9/171; H03H 9/176; H03H 9/562; H03H 9/564; H03H 9/568; H03H 2003/0428; H03H 2003/021; H03H 2003/023; H03H 3/02; H03H 9/173; H03H 9/174; H03H 9/131; H03H 9/54

USPC .................................................. 333/187, 188

See application file for complete search history.

(56) References Cited

U.S. PATENT DOCUMENTS

2015/0280100 A1* 10/2015 Burak .................... H03H 9/171 310/321
2018/0175275 A1* 6/2018 Nishihara .............. H03H 9/173
2022/0123718 A1* 4/2022 Burak ................ H03H 9/02118

* cited by examiner

*Primary Examiner* — Jorge L Salazar, Jr.
(74) *Attorney, Agent, or Firm* — Wiersch Law Group

(57) ABSTRACT

The method for fabricating a FBAR provided according to the present invention includes providing a substrate, forming a dielectric material layer on a surface of the substrate away from the substrate, forming a bottom electrode on a surface of the dielectric material layer away from the substrate, forming a piezoelectric material layer on a surface of the bottom electrode away from the substrate, forming an intermediate metal layer on a surface of the piezoelectric material layer away from the substrate, forming a mass load layer on a surface of the intermediate metal layer away from the substrate, and forming a top electrode on a surface of the mass load layer away from the substrate. In this way, process choices are increased, and flexibility in multiple mass load formation of the FBAR below top electrode and in a filter having the FBARs are increased, thereby improving sensitivity in the filter.

19 Claims, 5 Drawing Sheets

Prior Art

METHOD FOR FABRICATING FILM BULK ACOUSTIC RESONATOR (FBAR), FBAR, AND FILTER

TECHNICAL FIELD

The various embodiments of the present invention relate to the technical field of resonators, and in particular, to a method for fabricating a film bulk acoustic resonator (FBAR), a FBAR, and a filter.

BACKGROUND

Since piezoelectric crystal is capable of producing stable resonant frequency signals during operation, the piezoelectric crystal has been used as frequency control component of a radio communication device for decades. Generally, resonant frequency of a specific piezoelectric crystal can be tuned to by changing mass load of the piezoelectric crystal, which is specifically achieved by increasing or decreasing mass of an electrode part of the piezoelectric crystal.

However, in the conventional art, a method for fabricating a FBAR on a substrate having a top electrode deposited on a piezoelectric material layer uses a mass load lift-off process. It is not possible for the conventional art to form mass load both on the top electrode and below the top electrode as the lift-off process is not possible to be directly performed on the piezoelectric material layer made of aluminum nitride (AlN) due to losses from subsequent processes, resulting in less process choices, poor flexibility in mass load formation of the FBAR and in a filter having the FBARs, and poor sensitivity in the filter.

Therefore, it is necessary to provide an improved method for fabricating a FBAR to solve the above problems.

SUMMARY

An objective of the present invention is to provide a method for fabricating a FBAR, and a filter to solve the problem of less process choices and poor flexibility in mass load formation of the FBAR and in a filter having the FBARs.

According to one aspect of the present invention, a method for fabricating a FBAR is provided. The method includes providing a substrate, forming a dielectric material layer on a surface of the substrate away from the substrate, forming a bottom electrode on a surface of the dielectric material layer away from the substrate, forming a piezoelectric material layer on a surface of the bottom electrode away from the substrate, forming an intermediate metal layer on a surface of the piezoelectric material layer away from the substrate, forming a mass load layer on a surface of the intermediate metal layer away from the substrate, and forming a top electrode on a surface of the mass load layer away from the substrate. The intermediate metal layer is configured to protect the piezoelectric material layer from being affected in forming the mass load layer on the surface of the intermediate metal layer away from the substrate, and in forming the top electrode on the mass load layer.

As an improvement, forming the dielectric material layer on the surface of the substrate away from the substrate includes forming and patterning a sacrificial layer on the substrate and forming the dielectric material layer on the sacrificial layer.

As an improvement, forming the intermediate metal layer on the surface of the piezoelectric material layer away from the substrate includes performing metal deposition on the surface of the piezoelectric material layer away from the substrate to form the intermediate metal layer.

As an improvement, after forming a top electrode on the mass load layer, the method further includes dry etching the top electrode to form a final mass load layer.

As an improvement, forming the mass load layer on the surface of the intermediate metal layer away from the substrate includes:

coating photoresist on the intermediate metal layer;

lithography patterning on the photoresist to obtain patterns on the intermediate metal layer;

performing metal deposition on the intermediate metal layer; and lifting-off the metal layer to form the mass load layer.

As an improvement, forming the top electrode on the mass load layer includes:

performing metal deposition on the surface of the mass load layer away from the substrate to form a top electrode metal layer;

applying the mass load layer;

patterning at least one shunt resonator;

dry etching the mass load layer and the top electrode metal layer to form the top electrode over the at least one shunt resonator.

As an improvement, the metal deposition includes chemical vapor deposition (CVD), physical vapor deposition (PVD) and electroplating.

As an improvement, a total thickness includes a thickness of the intermediate metal layer and a thickness of the top electrode, the total thickness is adjusted according a frequency range of the FBAR, and the thickness of the top electrode has a thickness of 100 nm to 1000 nm.

As an improvement, the intermediate metal layer has a thickness of 5 nm to 1000 nm.

As an improvement, material the substrate includes any one of quartz, AlN, silicon, silicon carbide, sapphire, glass, polymer materials.

As an improvement, material of the piezoelectric material layer includes any one of AlN, zinc oxide, Lithium Niobate ($LiNbO_3$), and pb-based lanthanum-doped zirconate Titanate (PzT).

As an improvement, material of the intermediate metal layer includes any one of tungsten, platinum, titanium, molybdenum, and aluminum and other suitable metals.

As an improvement, material of the top electrode includes any one of tungsten, platinum, titanium, molybdenum, and aluminum and other suitable metals.

According to another aspect of the present invention, a FBAR is provided. The FBAR includes a substrate, a dielectric material layer formed on a surface of the substrate away from the substrate, a bottom electrode formed on a surface of the dielectric material layer away from the substrate, a piezoelectric material layer formed on the substrate, an intermediate metal layer formed on a surface of the piezoelectric material layer away from the substrate, a mass load layer formed on a surface of the intermediate metal layer away from the substrate, and a top electrode formed on a surface of the mass load layer away from the substrate. The intermediate metal layer is configured to protect the piezoelectric material layer from being affected in operations of forming the mass load layer on the surface of the intermediate metal layer away from the substrate, and forming the top electrode on the mass load layer.

As an improvement, a thickness of the intermediate metal layer ranges from 5 nm to 1000 nm.

As an improvement, the FBAR further includes a final mass load layer formed by dry etching the top electrode.

As an improvement, a total thickness includes a thickness of the intermediate metal layer and a thickness of the top electrode, the total thickness is adjusted according a frequency range of the FBAR resonator, and the thickness of the top electrode has a thickness of 100 nm to 1000 nm.

As an improvement, material the substrate includes any one of quartz, AlN, silicon, silicon carbide, sapphire, glass, and polymer materials. Material of the piezoelectric material layer includes any one of AlN, zinc oxide, Lithium Niobate ($LiNbO_3$), and pb-based lanthanum-doped zirconate Titanate (PzT).

As an improvement, material of the intermediate metal layer includes any one of tungsten, platinum, titanium, molybdenum, and aluminum and other suitable metals, and material of the top electrode includes any one of tungsten, platinum, titanium, molybdenum, and aluminum and other suitable metals.

According to a further aspect of the present invention, a filter is provided. The filter includes a first FBAR group and a second FBAR group. The first FBAR group is a combination of at least two FBARs formed on a same substrate and connected in series with a predetermined circuit, and the second FBAR group is a combination of at least two FBARs connected in parallel with another predetermined circuit. Each of the at least two FBARs in the first FBAR group and the at least two FBARs in the second FBAR group includes a substrate, a dielectric material layer formed on a surface of the substrate away from the substrate, a bottom electrode formed on a surface of the dielectric material layer away from the substrate, a piezoelectric material layer formed on the substrate, an intermediate metal layer formed on a surface of the piezoelectric material layer away from the substrate, a mass load layer formed on a surface of the intermediate metal layer away from the substrate, and a top electrode formed on a surface of the mass load layer away from the substrate. The intermediate metal layer is configured to protect the piezoelectric material layer from being affected in operations of forming the mass load layer on the surface of the intermediate metal layer away from the substrate, and forming the top electrode on the mass load layer. A thickness and/or pattern of the mass load layer of each of the at least two FBARs in the first FBAR group and the at least two FBARs in the second FBAR group is enabled to be the same or different.

BRIEF DESCRIPTION OF THE DRAWINGS

For more clearly illustrating embodiments of the present invention or the technical solutions in the conventional technology, drawings referred to for describing the embodiments or the conventional technology will be briefly described hereinafter. Apparently, drawings in the following description are only examples of the present invention, and for the person skilled in the art, other drawings may be acquired based on the provided drawings without any creative efforts.

DETAILED DESCRIPTION

In order to make the purpose, technical solutions, and advantages of the present invention more obvious and understandable, the present invention will be described clearly and completely below in combination with the embodiments of the present invention and accompanying drawings, where the same or similar references throughout represent the same or similar elements or elements with the same or similar functions. It should be understood that the embodiments of the present invention described below are only used to explain the present invention and are not used to limit the present invention, that is, based on the embodiments of the present invention, all other embodiments obtained by ordinary technicians in the art without doing creative work shall fall within the scope of protection of the present invention. In addition, the technical features involved in each embodiment of the present invention described below can be combined as long as there is no conflict between them.

Figures 1, 2:
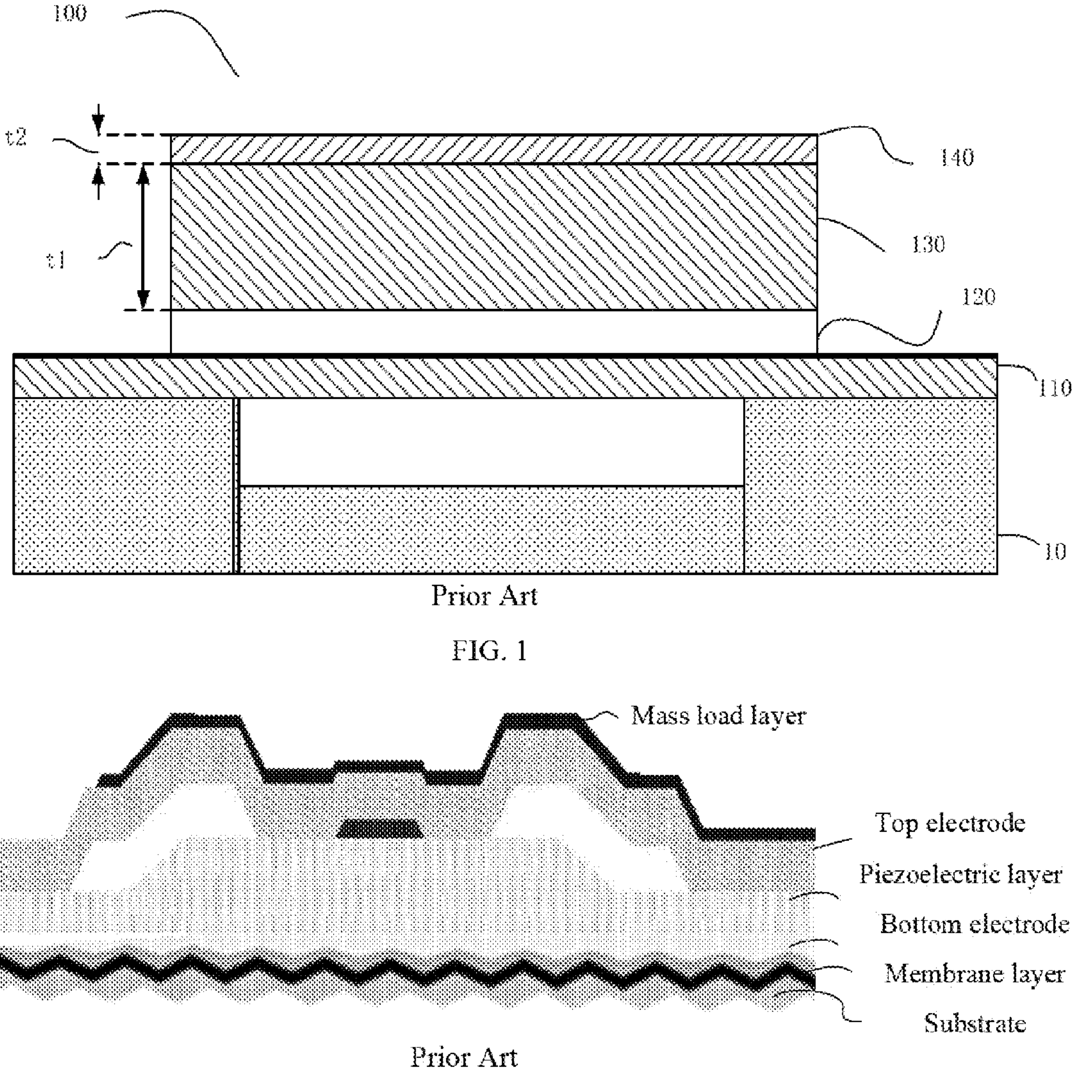
FIG. 1 is a cross-sectional structural view of a conventional FBAR.
FIG. 2 is a schematic view of mass load formation of the conventional FBAR shown in FIG. 1.

Referring to FIG. 1, a conventional FBAR 100 includes a piezoelectric layer 130, an upper electrode 140 and a lower electrode 120 provided respectively on the upper and lower surfaces of the piezoelectric layer 130, and a seed layer 110 supporting the lower electrode 120 on a substrate 10.

The FBAR 100 uses bulk longitudinal acoustic waves in the piezoelectric layer 130. When an electric field is created between the two electrodes via an impressed voltage, the piezoelectric layer 130 converts part of the electrical energy into mechanical energy in the form of sound waves. The sound waves propagate in the same direction as the electric field and reflect off of the electrode/air interface.

The resonant frequency, one of resonant characteristics of the FBAR 100, varies depending on the thickness t1 of the piezoelectric layer 130. In recent small-sized thin film resonators, a new technology is adopted to adjust the resonant frequency using the so-called mass loading effect that causes a change of mass according to the thickness t2 of the upper electrode 140, without changing the thickness t1 of the piezoelectric layer 130 which results in a greater variation of the resonant frequency.

In the conventional FBAR 100, the lower electrode 120 receives chemical and mechanical impacts during repeated deposition and etching processes during manufacturing of the FBAR 100. To endure such chemical and mechanical impacts, the lower electrode 120 should be made of a material having high chemical and mechanical strength, such as molybdenum (Mo) or tungsten (W), rather than a light metal, such as aluminum. However, both molybdenum and tungsten have a greater vibration transfer loss than aluminum due to their high damping factor and are not easily processed. These materials increase the manufacturing cost and complicate the manufacturing process, while lowering overall efficiency of the FBAR 100.

As shown in FIG. 2, in the conventional FBAR, with the structure described above, mass load can only be formed on the top electrode by process such as applying a pattern mask, and etching the top electrode. Since process such as etching and lifting-off affects or even destroys the piezoelectric layer, no mass load can be formed below the top electrode or on the piezoelectric layer, which results in less process choices, poor flexibility in mass load formation of the FBAR and in a filter having the FBARs, and poor accuracy in the filter.

Figure 3:
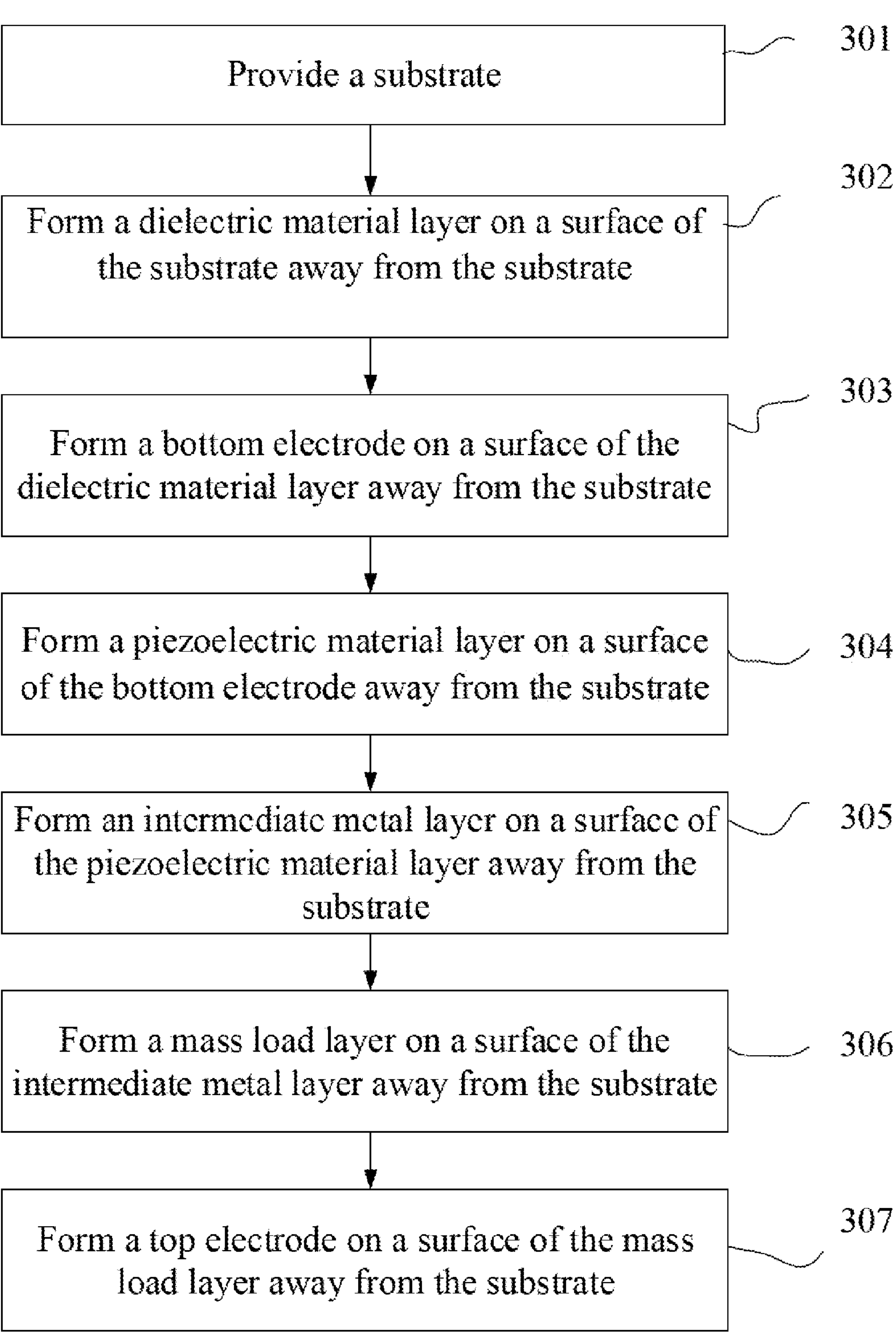
FIG. 3 is a flow chart of a method for fabricating a FBAR provided according to some embodiments of the present invention.

Referring to FIG. 3, a method for fabricating a FBAR provided according to some embodiments of the present invention includes following operations 301 to 307.

In operation 301, a substrate having a top surface is provided.

In some embodiments, material of the substrate includes any one of silicon, silicon carbide, sapphire, glass.

In operation 302, a dielectric material layer is formed on the top surface of the substrate.

In some embodiments, forming the dielectric material layer on the surface of the substrate away from the substrate includes forming and patterning a sacrificial layer on the substrate, and forming the dielectric material layer on the sacrificial layer. The sacrificial layer is made of a material that is much more easily etched than the thermal oxides utilized in prior art methods.

The dielectric material layer is formed on a substrate by metal deposition to support the whole FBAR on the substrate. The dielectric material layer vibrates together with the vibration of the piezoelectric material layer. The dielectric material layer may be made of silicon nitride ($Si_3N_4$), or silicon dioxide ($SiO_2$), or other insulating materials. Preferably, the thickness of the dielectric material layer should be adjusted within a predetermined range of thickness in accordance with the limitations in the manufacturing process.

In this case, the resonant frequency of the FBAR can be precisely adjusted without any damage to the bottom electrode. It is possible to reduce the chemical and mechanical impacts transferred to the bottom electrode during the processes of depositing and etching the piezoelectric material layer and the top electrode, thereby enabling free selection of a material for the bottom electrode.

In operation 303, a bottom electrode is formed on a surface of the dielectric material layer away from the substrate.

In some embodiments, the bottom electrode is made of a metallic material having a greater Young's Modulus than material of the dielectric material layer. The overall rigidity of the dielectric material layer is thus improved, which consequently prevents distortion of the dielectric material layer and improves the stability and reliability of the dielectric material layer.

In operation 304, a piezoelectric material layer is formed on a surface of the bottom electrode away from the substrate.

In some embodiments, material of the piezoelectric material layer includes any one of AlN, zinc oxide, Lithium Niobate ($LiNbO_3$), pb-based lanthanum-doped zirconate Titanate (PzT) and other suitable materials.

In operation 305, an intermediate metal layer is formed on a surface of the piezoelectric material layer away from the substrate.

In some embodiment, forming the intermediate metal layer on the surface of the piezoelectric material layer away from the substrate includes performing metal deposition on the surface of the piezoelectric material layer away from the substrate to form the intermediate metal layer. The intermediate metal layer is configured to protect the piezoelectric material layer from being affected in subsequent operations, such as forming the mass load layer on the surface of the intermediate metal layer away from the substrate, and forming the top electrode on the mass load layer.

With the intermediate metal layer formed between the piezoelectric material layer and the mass load layer, mass load is possible to be formed below the top electrode. In addition, the intermediate metal layer is configured to protect the piezoelectric material layer from being affected by subsequent processes, such as lift-off and dry etch. That is, processing options to form the mass load are increased, the mass load can be easily formed below the top electrode by lift-off or dry etch, which increases process choices, increases flexibility in mass load formation of the FBAR and in a filter having the FBARs, thereby increasing accuracy in the filter.

Preferably, material of the intermediate metal layer includes any one of tungsten, platinum, titanium, molybdenum, and aluminum and other suitable metals.

In operation 306, a mass load layer is formed on a surface of the intermediate metal layer away from the substrate.

In some embodiments, forming the mass load layer on the surface of the intermediate metal layer away from the substrate includes coating photoresist on the intermediate metal layer, lithography patterning on the photoresist to obtain patterns on the intermediate metal layer, performing metal deposition on the intermediate metal layer, and lifting-off the metal layer to form the mass load layer.

In some embodiments, for the mass loading layer, it is preferable to select a material that causes small variation of resonant frequency of the FBAR according to the change of its thickness.

In operation 307, a top electrode is formed on a surface of the mass load layer away from the substrate.

In some embodiments, forming the top electrode on the mass load layer includes performing metal deposition on the surface of the mass load layer away from the substrate to form a top electrode metal layer, applying the mass load layer, coating photoresist over at least one shunt resonator, and dry etching the mass load layer and the top electrode metal layer to form the top electrode over the at least one shunt resonator.

Preferably, material of the top electrode includes any one of tungsten, platinum, titanium, molybdenum, and aluminum and other suitable metals.

Figure 4:
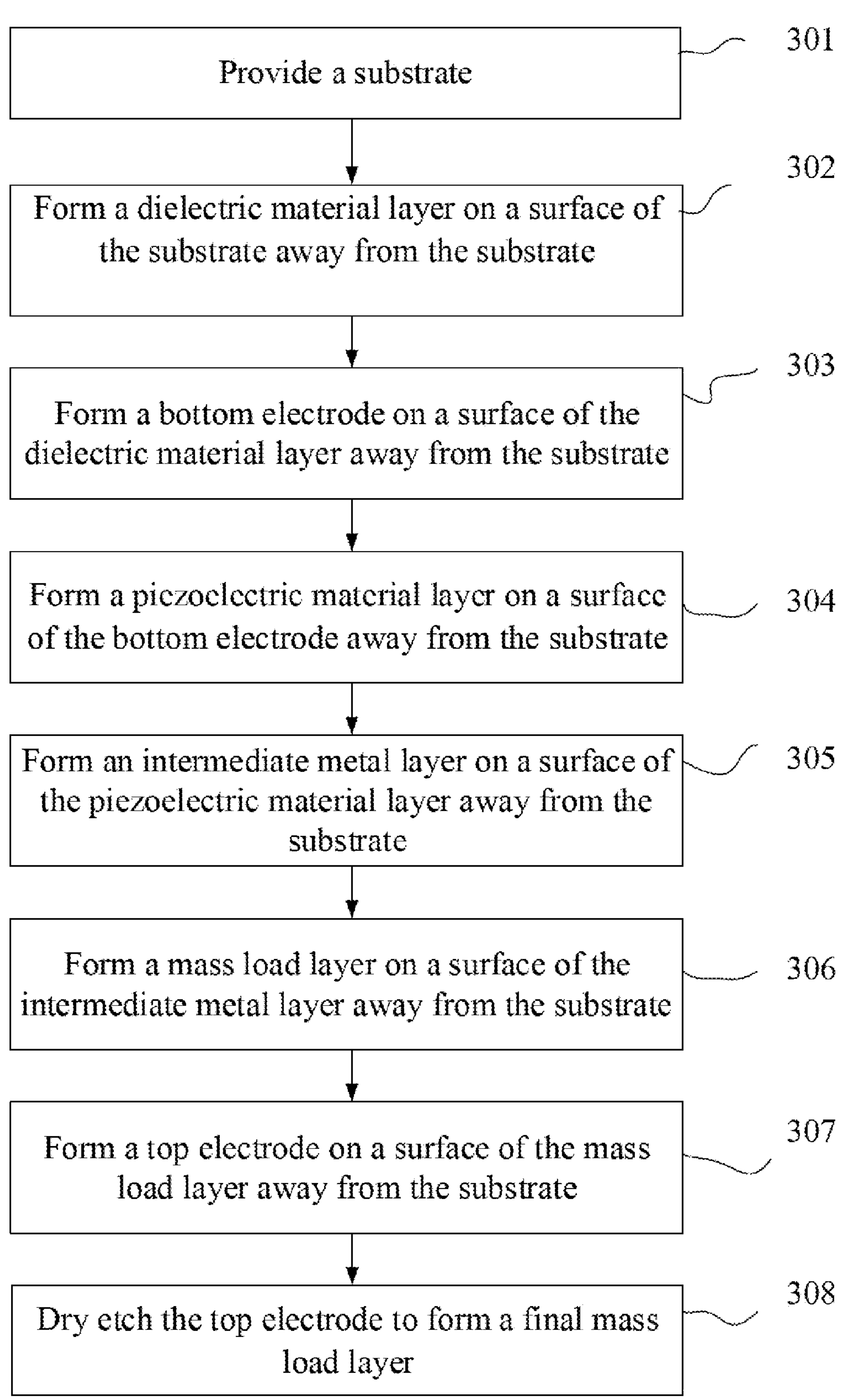
FIG. 4 is a flow chart of a method for fabricating a FBAR provided according to some embodiments of the present invention.

Referring to FIG. 4, in some embodiments, after forming a top electrode on the mass load layer, the method further includes an operation 308.

In operation 308, the top electrode is dry etched to form a final mass load layer.

In some embodiments, the metal deposition includes CVD, PVD, electroplating, and other suitable processes.

In some embodiments, a total thickness includes a thickness of the intermediate metal layer and a thickness of the top electrode, the total thickness is adjusted according a frequency range of the FBAR, and the thickness of the top electrode has a thickness of 100 nm to 1000 nm. Preferably, the intermediate metal layer has a thickness of 5 nm to 1000 nm.

Figure 5:
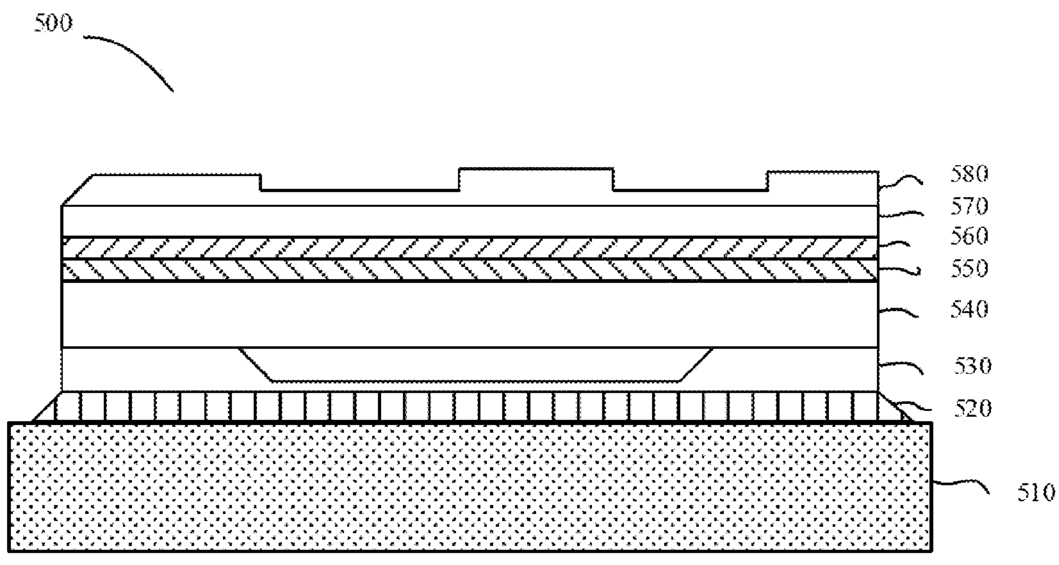
FIG. 5 is a cross-sectional structural view of a FBAR provided according to some embodiments of the present invention.

Referring to FIG. 5, a FBAR 500 provided according to some embodiments of the present invention includes a substrate 510, a dielectric material layer 520 formed on a surface of the substrate 510 away from the substrate 510, a bottom electrode 530 formed on a surface of the dielectric material layer 520 away from the substrate 510, a piezoelectric material layer 540 formed on a surface of the bottom electrode 530 away from the substrate 510, an intermediate metal layer 550 formed on a surface of the piezoelectric material layer 540 away from the substrate 510, a mass load layer 560 formed on a surface of the intermediate metal layer 550 away from the substrate 510, and a top electrode 570 formed on a surface of the mass load layer 560 away from the substrate 510.

In some embodiments, the FBAR 500 further includes a final mass load layer 580 formed by dry etching the top electrode 570. The intermediate metal layer 550 is configured to protect the piezoelectric material layer 540 from being affected in operations of forming the mass load layer 560 on the surface of the intermediate metal layer 550 away from the substrate 510, and forming the top electrode 570 on the mass load layer 560.

The FBAR 500 is provided according to the operations shown in FIG. 3 and FIG. 4. Therefore, reference may be back to above description of FIG. 3 and FIG. 4 for related contents of the FBAR 500.

Figure 6:
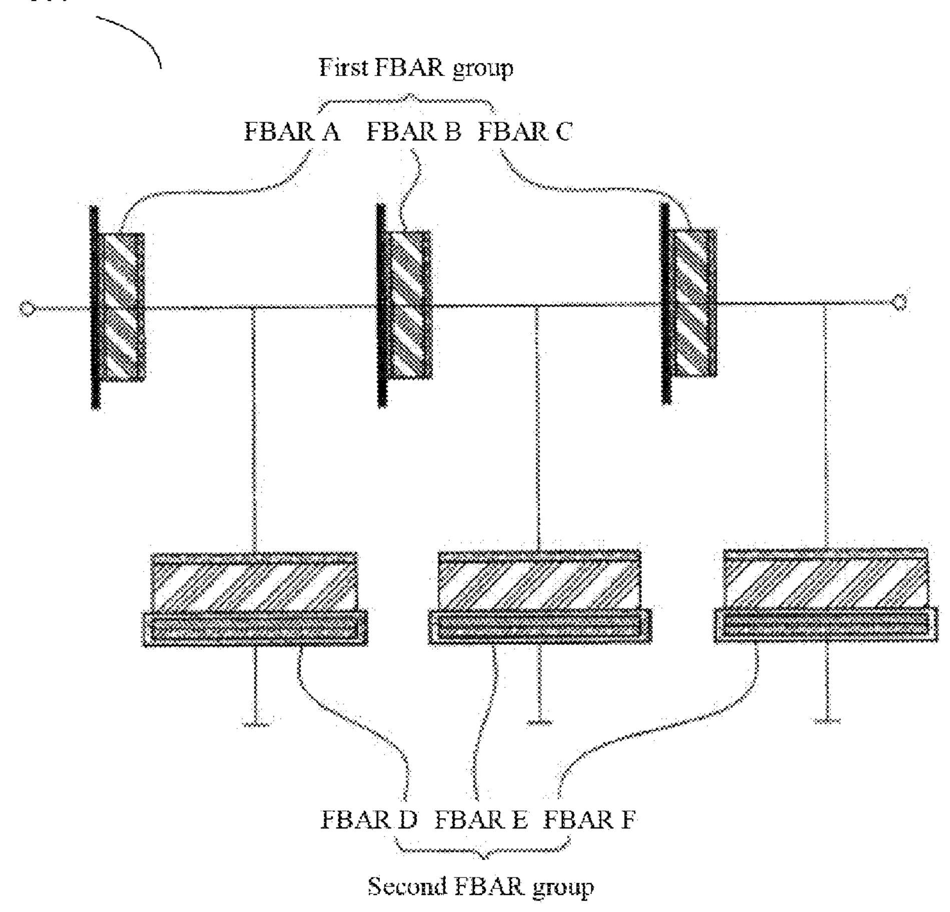
FIG. 6 is a schematic structural view of a filter provided according to some embodiments of the present invention.

As shown in FIG. 6, a filter 600 is provided according to some embodiments of the present invention, and the filter 600 includes a first FBAR group and a second FBAR group, where the first FBAR group is a combination of at least two FBARs formed on a same substrate and connected in series (series FBARs) with a predetermined circuit, the second FBAR group is a combination of at least two FBARs connected in parallel (shunt FBARs) with another predetermined circuit. Each of the at least two FBARs in the first FBAR group and the at least two FBARs in the second FBAR group includes a substrate, a dielectric material layer formed on a surface of the substrate away from the substrate, a bottom electrode formed on a surface of the dielectric material layer away from the substrate, a piezoelectric material layer formed on the substrate, an intermediate metal layer formed on a surface of the piezoelectric material layer away from the substrate, a mass load layer formed on a surface of the intermediate metal layer away from the substrate, a top electrode formed on a surface of the mass load layer away from the substrate. In some embodiments, each of the at least two FBARs in the first FBAR group and the at least two FBARs in the second FBAR group further includes a final mass load layer. The intermediate metal layer is configured to protect the piezoelectric material layer from being affected in operations of forming the mass load layer on the surface of the intermediate metal layer away from the substrate, and forming the top electrode on the mass load layer.

The thickness and/or pattern of the mass load layer of each of the at least two FBARs in the first FBAR group and the at least two FBARs in the second FBAR group is enabled to be the same or different.

In some embodiments, the number of FBARs in the first FBAR group and the number of FBARs in the second FBAR group are both exemplarily three, as shown in FIG. 6. Specifically, the first FBAR group includes three FBARs, e.g., FBAR A, FBAR B, and FBAR C, respectively, and the second FBAR group includes three FBARs, e.g., FBAR D, FBAR E, and FBAR F, respectively. However, the number of FBARs in the first FBAR group and the number of FBARs in the second FBAR group is not limited to the number of the above examples, as long as the number is equal to or greater than two, so that a group of resonators can be formed.

Figure 7:
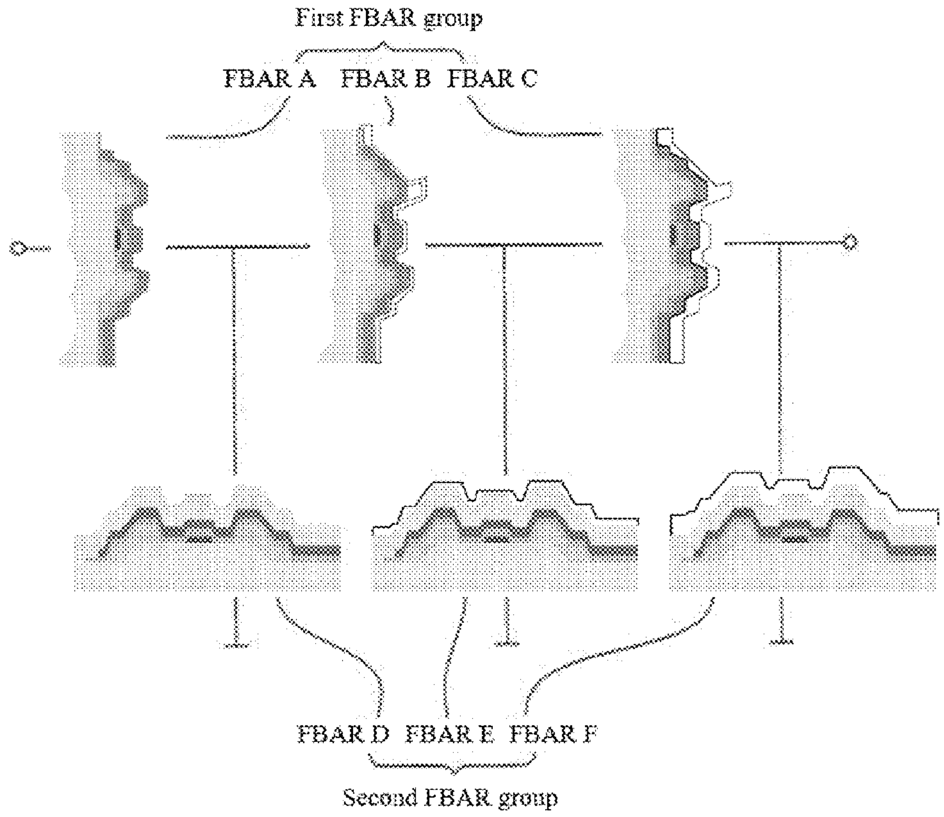
FIG. 7 is a schematic view of mass load patterning formed in the filter provided according to some embodiments of the present invention.

Referring to FIG. 7, an example of mass load formation in the filter is described. In this example, mass load is formed on the above six FBARs in different ways, respectively.

Specifically, the mass load layer is formed by lifting-off between the intermediate metal layer and the top electrode in FBAR A, FBAR B and FBAR C. The only difference between the FBAR A, FBAR B and FBAR C is thickness of the mass load layer is gradually increased from the FBAR A to the FBAR C. The mass load layer the mass load layer is formed by lifting-off between the intermediate metal layer and the top electrode in FBAR D, FBAR E and FBAR F, and the final mass load layer is further formed on the top electrode by dry etching. The thickness of the mass load layer is gradually increased from FBAR D to FBAR F, and the thickness of the final mass load layer is also gradually increased from FBAR D to FBAR F.

In some embodiments, the thickness and/or pattern of the mass load layer of each of the at least two FBARs in the first FBAR group and the at least two FBARs in the second FBAR group is the same, or the thickness and/or pattern of the mass load layer of each of the at least two FBARs in the first FBAR group, and the thickness and/or pattern of the mass load layer of each of the at least two FBARs in the second FBAR group is different. That is, the thickness and/or pattern of the mass load layer within a filter or between filter design can be flexibly controlled. Therefore, processing options to form the mass load are increased, the mass load can be easily formed below the top electrode by lift-off or dry etch, which increases process choices, increases flexibility in mass load formation of the FBAR and in a filter having the FBARs, thereby increasing accuracy in the filter.

It should be noted that the embodiments in the description are described in a progressive manner. Each of the embodiments mainly focuses on its differences from other embodiments, and reference may be made among these embodiments with respect to the same or similar parts. For product embodiments, since they are similar to those method embodiments, the description is simple, and reference may be to the description of the method embodiments with respect to related contents.

It should also be noted that in the content of the present invention, relational terms such as first and second are only used to distinguish one entity or operation from another entity or operation, and do not necessarily require or imply that there is any such actual relationship or order between these entities or operations. Moreover, terms such as "includes", "comprises" or any other variations thereof are intended to cover non-exclusive inclusion, so that a process, a method, an article, or a device including a series of elements not only includes those elements, but also includes other elements that are not explicitly listed, or elements inherent to the process, the method, the article, or the device. If there are no more restrictions, an element preceding by the statement "includes a . . . " does not exclude the existence of other same elements in the process, the method, the article, or the device that includes the element.

The above illustration of the disclosed embodiments can enable those skilled in the art to implement or use the present application. Various modifications to the embodiments are apparent to the person skilled in the art, and the general principle herein can be implemented in other embodiments without departing from the spirit or scope of the present application. Therefore, the present application is not limited to the embodiments described herein, but should be in accordance with the broadest scope consistent with the principle and novel features disclosed herein.

What is claimed is:

1. A method for fabricating a film bulk acoustic resonator (FBAR), comprising:

providing a substrate having a top surface;

forming a dielectric material layer on the top surface of the substrate;

forming a bottom electrode on a surface of the dielectric material layer away from the substrate;

forming a piezoelectric material layer on a surface of the bottom electrode away from the substrate;

forming an intermediate metal layer on a surface of the piezoelectric material layer away from the substrate;

forming a mass load layer on a surface of the intermediate metal layer away from the substrate; and forming a top electrode on a surface of the mass load layer away from the substrate;

dry etching the top electrode to form a final mass load layer;

wherein the intermediate metal layer is configured to protect the piezoelectric material layer from being affected in forming the mass load layer on the surface of the intermediate metal layer away from the substrate, and in forming the top electrode on the mass load layer.

2. The method according to claim 1, wherein forming the dielectric material layer on the surface of the substrate away from the substrate comprises:

forming and patterning a sacrificial layer on the substrate;

forming the dielectric material layer on the sacrificial layer, wherein the dielectric material layer can be an AlN layer, SiN layer or any suitable dielectric film.

3. The method according to claim 1, wherein forming the intermediate metal layer on the surface of the piezoelectric material layer away from the substrate comprises:

performing metal deposition on the surface of the piezoelectric material layer away from the substrate to form the intermediate metal layer.

4. The method according to claim 1, wherein after forming a top electrode on the mass load layer, the method further comprises dry etching the top electrode to form a final mass load layer.

5. The method according to claim 1, wherein forming the mass load layer on the surface of the intermediate metal layer away from the substrate comprises:

coating photoresist on the intermediate metal layer;

lithography patterning on the photoresist to obtain patterns on the intermediate metal layer;

performing metal deposition on the intermediate metal layer; and lifting-off the metal layer to form the mass load layer.

6. The method according to claim 1, wherein forming the top electrode on the mass load layer comprises:

performing metal deposition on the surface of the mass load layer away from the substrate to form a top electrode metal layer;

applying the mass load layer;

patterning at least one shunt resonator;

dry etching the mass load layer and the top electrode metal layer to form the top electrode over the at least one shunt resonator.

7. The method according to claim 6, wherein the metal deposition comprises physical vapor deposition (PVD), chemical vapor deposition (CVD), electroplating, and other suitable processes.

8. The method according to claim 6, wherein a total thickness comprises a thickness of the intermediate metal layer and a thickness of the top electrode, the total thickness is adjusted according a frequency range of the FBAR, and the top electrode has a thickness of 100 nm to 1000 nm.

9. The method according to claim 8, wherein the intermediate metal layer has a thickness of 5 nm to 1000 nm.

10. The method according to claim 1, wherein material of the substrate comprises any one of quartz, AIN, silicon, silicon carbide, sapphire, glass, and polymer materials.

11. The method according to claim 1, wherein material of the piezoelectric material layer comprises any one of Lithium Niobate (LiNbO3), aluminum nitride (AlN), zinc oxide, or pb-based lanthanum-doped zirconate Titanate (PzT).

12. The method according to claim 1, wherein material of the intermediate metal layer comprises any one of tungsten, platinum, titanium, molybdenum, and aluminum.

13. The method according to claim 1, wherein material of the top electrode comprises any one of tungsten, platinum, titanium, molybdenum, and aluminum.

14. A FBAR, comprising:

a substrate;

a dielectric material layer formed on a surface of the substrate away from the substrate;

a bottom electrode formed on a surface of the dielectric material layer away from the substrate;

a piezoelectric material layer formed on the substrate;

an intermediate metal layer formed on a surface of the piezoelectric material layer away from the substrate;

a mass load layer formed on a surface of the intermediate metal layer away from the substrate; and a top electrode formed on a surface of the mass load layer away from the substrate;

a final mass load layer formed by dry etching the top electrode;

wherein the intermediate metal layer is configured to protect the piezoelectric material layer from being affected in operations of forming the mass load layer on the surface of the intermediate metal layer away from the substrate, and forming the top electrode on the mass load layer.

15. The FBAR according to claim 14, wherein the intermediate metal layer has a thickness in a range of 5 nm to 1000 nm.

16. The FBAR according to claim 14, wherein a total thickness comprises a thickness of the intermediate metal layer and a thickness of the top electrode, the total thickness is adjusted according a frequency range of the FBAR resonator, and the top electrode has a thickness of 100 nm to 1000 nm.

17. The FBAR according to claim 14, material the substrate comprises any one of quartz, AIN, silicon, silicon carbide, sapphire, glass, and polymer materials; material of the piezoelectric material layer comprises any one of aluminum nitride, zinc oxide, or pb-based lanthanum-doped zirconate Titanate (PzT).

18. The FBAR according to claim 17, material of the intermediate metal layer comprises any one of tungsten, platinum, titanium, molybdenum, and aluminum, and material of the top electrode comprises any one of tungsten, platinum, titanium, molybdenum, and aluminum.

19. A filter comprising a first FBAR group and a second FBAR group, wherein the first FBAR group is a combination of at least two FBARs formed on a same substrate and connected in series with a predetermined circuit, the second FBAR group is a combination of at least two FBARs connected in parallel with another predetermined circuit;

wherein each of the at least two FBARs in the first FBAR group and the at least two FBARs in the second FBAR group comprises:

a substrate;

a dielectric material layer formed on a surface of the substrate away from the substrate;

a bottom electrode formed on a surface of the dielectric material layer away from the substrate;

a piezoelectric material layer formed on the substrate;

an intermediate metal layer formed on a surface of the piezoelectric material layer away from the substrate;

a mass load layer formed on a surface of the intermediate metal layer away from the substrate; and a top electrode formed on a surface of the mass load layer away from the substrate;

a final mass load layer formed by dry etching the top electrode;

wherein the intermediate metal layer is configured to protect the piezoelectric material layer from being affected in operations of forming the mass load layer on the surface of the intermediate metal layer away from the substrate, and forming the top electrode on the mass load layer.

* * * * *